United States Patent [19]
Telle

[11] Patent Number: 5,553,087
[45] Date of Patent: Sep. 3, 1996

[54] FREQUENCY STABILIZED LASER DIODE

[75] Inventor: Helmut H. Telle, Swansea, United Kingdom

[73] Assignee: Renishaw plc, Gloucestershire, United Kingdom

[21] Appl. No.: 369,336

[22] Filed: Jan. 6, 1995

Related U.S. Application Data

[63] Continuation of Ser. No. 231,057, Apr. 22, 1994, abandoned.

[30] Foreign Application Priority Data

Apr. 24, 1993 [GB] United Kingdom .................. 9308519

[51] Int. Cl.⁶ .............................. H01S 3/133; H03L 7/26
[52] U.S. Cl. .................. 372/32; 372/35; 372/38; 331/3; 331/94.1
[58] Field of Search ........................... 372/32, 35, 38; 331/3, 94.1; 250/339.03

[56] References Cited

U.S. PATENT DOCUMENTS

| | | | |
|---|---|---|---|
| 4,410,273 | 10/1983 | Mantz et al. | 250/399.03 |
| 4,509,130 | 4/1985 | Menzies et al. | 250/339.03 |
| 4,701,607 | 10/1987 | El Hanany et al. | 372/32 |
| 4,833,681 | 5/1989 | Akiyama et al. | 372/32 |
| 4,922,480 | 5/1990 | Bosch | 870/3 |
| 5,025,448 | 6/1991 | Sudo et al. | 372/32 |
| 5,063,568 | 11/1991 | Chiba et al. | 372/32 |
| 5,185,643 | 2/1993 | Vry et al. | 372/32 |

FOREIGN PATENT DOCUMENTS

| | | |
|---|---|---|
| 3706635 | 9/1988 | Germany . |
| 4039371 | 6/1992 | Germany . |
| 4-157780 | 5/1992 | Japan . |
| WO87/01875 | 3/1987 | WIPO . |

OTHER PUBLICATIONS

R. A. Valenzuela et al., "Frequency Stabilisation of AlGaAs Lasers to Absorption Spectrum of Rubidium Using Zeeman Effect," *Electronics Letters*, Jun. 9, 1988, vol. 24, No. 12, pp. 725–726.

M. Tetu et al., "Multiwavelength Sources Using Laser Diodes Frequency–Locked to Atomic Resonances," *Journal of Lightwave Technology*, vol. 7, No. 10, Oct. 1989, pp. 1540–1547.

(List continued on next page.)

*Primary Examiner*—Rodney E. Bovernick
*Assistant Examiner*—Robert McNutt
*Attorney, Agent, or Firm*—Oliff & Berridge

[57] ABSTRACT

A laser diode has its frequency locked to the frequency of an absorption line of rubidium (water and oxides of nitrogen are also disclosed). The level of absorption, and hence the frequency relationship of the laser light with respect to the absorption line is detected by a photodetector. The absolute frequency of the laser light is guaranteed by initially adjusting the temperature of the diode until the frequency of the light is brought into coincidence with a first absorption line, subsequently maintaining the temperature at a constant level, and adjusting the drive current of the diode until the frequency of laser light achieves coincidence with an adjacent transition line. This ensures that the diode frequency is locked to the same absorption line each occasion the diode is switched on. Additionally, the change in drive current between coincidence with the two adjacent absorption lines is monitored as a further check that the correct transition line has been selected. An error signal for a current servo, which drives the diode, is generated from the photodetector output. An oscillating magnetic field, causing cyclic Zeeman splitting of the absorption lines, and hence cyclic modulation of their frequency, causes a corresponding modulation in the photodetector output. Successive half cycles of the photodetector output are integrated and subtracted from each other in order to generate the error signal; the sign of the error signal thus being indicative of the direction of frequency drift in the laser light.

3 Claims, 2 Drawing Sheets

OTHER PUBLICATIONS

H. Wolfelschneider et al., "Intensity–Indpendent Frequency Stabilization of Semiconductor Lasers Using a Fiber Optic Fabry–Perot Resonator," *Journal of Optical Communications*, 5 (1984) Jun., No. 2, Berlin, Germany, pp. 53–55.

Woan–Hue Hong et al., "Simultaneously Stabilization of the Frequency and Output Power of Semiconductor Laser for Coherent Optical Fiber Communication Systems," *Proceedings TENCON 87*, v. 2, Aug. 25–28, 1987, Seoul, Korea, pp. 739–743.

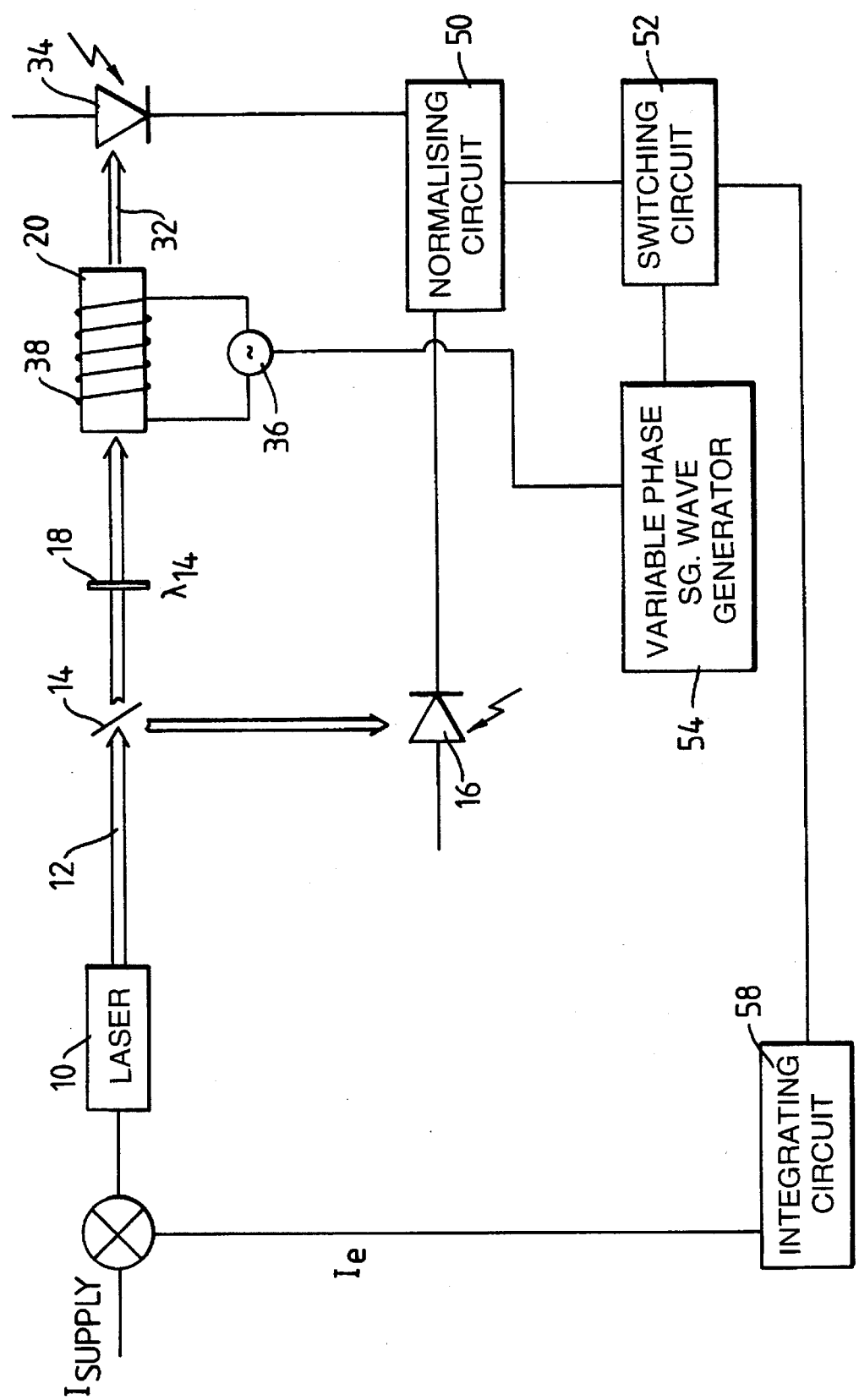

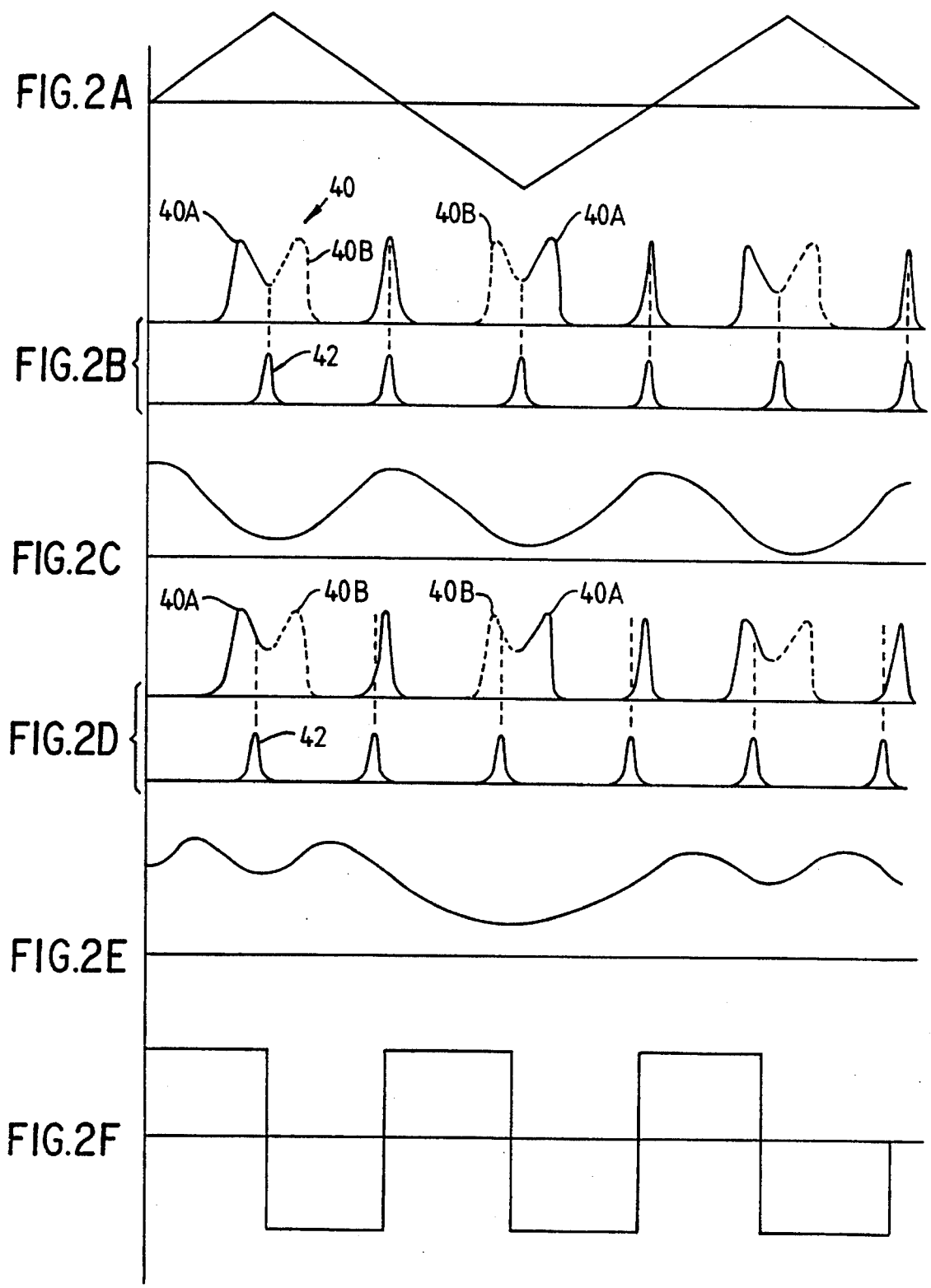

FREQUENCY STABILIZED LASER DIODE

This is a continuation of application Ser. No. 08/231,057 filed Apr. 22, 1994, now abandoned.

The present invention relates to a laser diode having a stabilised frequency of emission, used, for example, in a Raman microscope or metrological laser interferometer.

It is known to provide a laser diode whose frequency is maintained at an absolute known value, by locking the diode frequency to a particular transition line of rubidium. Typically the transition line will be one of the two D absorption lines. Light from the diode is used to excite one of these transitions, and a photodetector is used to detect the level of absorption of the light by the rubidium atoms. The level of absorption is indicative of the frequency of the laser light, with more light being absorbed closer to the peak of the absorption line. A current servo, responsive to the output of the photodetector, maintains the laser at a frequency, which, for a given line, corresponds to the maximum intensity of absorption (after normalising the output of the photodetector to take account of fluctuations in the output intensity of the diode). The frequency of the laser is additionally modulated by an amount no greater than approximately one tenth of the required level of stability, in order to obtain a corresponding modulation in the output of the photodetector. This modulation of the laser output frequency enables the generation of an error signal for the servo, by subtracting the values obtained from integrating consecutive half cycles of the waveform from the photodetector. The magnitude of the resultant error signal is indicative of the magnitude of the frequency variation from the desired peak frequency, and the sign is indicative of the direction.

A first aspect of the present invention relates to a technique initially locating the frequency of the laser light from the diode within the bandwidth of a transition line of a given substance, which has a plurality of such lines in relatively close proximity. In accordance with the present invention the temperature of the diode is altered until a first transitions has been located, whereupon the temperature of the diode is kept stable and the current passing through the diode is altered until the frequency of the laser light from the diode has the desired correspondence with the bandwidth of an adjacent transition. In this way, the diode may be frequency stabilised at the same absolute frequency each time it is switched on, thus avoiding the possibility of stabilising the diode at the frequency of different transitions (which lie adjacent each other) on different occasions.

A further independent aspect of the present invention relates to the generation of a modulation in the output of the photodetector, in order to provide an indication of the direction in which the frequency of the laser light has drifted. A second aspect of the present invention provides a frequency stabilising apparatus for a laser diode which emits a beam of laser light: an absorption cell provided in the path of the laser beam, containing a substance possessing transition lines whose frequency lie in the region of the laser light frequency; a photodetector, situated downbeam of the absorption cell for generating an electrical signal corresponding to the intensity of light incident thereon; means for generating a magnetic field in the region of the absorption cell, to cause splitting of said lines; means for cyclically modulating the output of the photodetector; a control, for controlling the drive current of the diode in dependence upon the output of the photodetector, thereby to maintain the frequency of the laser light at a constant value, including means for integrating consecutive half cycles of said photodetector output, and subtracting the values of said integrations to generate an error signal; wherein said cyclically modulating photodetector output is provided by a modulation in the strength of said magnetic field.

The substance in the absorption cell is chosen in dependence upon the desired frequency to which the laser is to be locked. Examples are rubidium, water, and oxides of nitrogen.

An embodiment of the invention will now be described, by way of example, and with reference to the accompanying drawings in which:

FIG. 1 is a schematic illustration of an arrangement for generating a stabilised laser beam from a laser diode; and FIGS. 2A–F are signal diagrams for the apparatus of FIG. 1.

Referring now to FIG. 1, a laser diode 10 is supplied with a constant supply current $I_0$, and as a result emits a laser beam 12. The beam 12 is incident upon a beam splitter 14 which diverts a fraction of the beam on to a reference photodiode 16. The remainder of the beam passes through a quarter wave plate 18, and enters a rubidium cell 20. The frequency of the emitted light from the laser diode 10 is dependent upon the temperature of the diode and the supply current to the diode. It has been found to be very difficult to guarantee a predetermined stabilised frequency of emission from the diode merely by attempting to maintain the temperature and supply current at a constant level, and moreover, the frequency of emission may vary for given values of temperature and current each time the diode is activated. It has therefore proved necessary to lock the frequency of the emitted light from the diode to an external reference value which, in this case, is the frequency of the photons in a D transition of rubidium. This is done by exciting D transitions in the rubidium atoms provided in the cell 20, and then observing the corresponding reduction in the intensity of the laser beam transmitted through the cell due to absorption of the photons in the beam. The two isotopes of rubidium each have a D transition split into two fine structure lines corresponding to electron spins of $+\frac{1}{2}$ and $-\frac{1}{2}$, giving four basic transition lines. The temperature of the laser diode is controlled by e.g. a Thermoelectric cooler. During initial operation, the temperature of the diode 10 is adjusted so that the frequency of emission of the light from the laser diode 10 is known to lie either well below, or well above that of the four D transition lines of natural rubidium. The Thermoelectric cooler is then adjusted to alter the frequency of the light emitted from the diode 10 until one of the four aforementioned transitions in the rubidium cell 20 is excited, at which point there will be a sharp reduction in the intensity of the transmitted beam 32, which is incident upon photodetector 34. The Thermoelectric cooler is then set to maintain the temperature at a constant level and the supply current $I_0$ is adjusted until an adjacent transition line is excited in the cell 20 (these transitions each being detected using a peak detector). Preferably, the change in drive current between the frequency of the laser achieving coincidence with the first and second transition peaks is monitored, by way of a quality control method to ensure that the same peak is reached each time.

Because the frequency bandwidth of the light from the diode 10 is significantly narrower than the frequency bandwidth of the light in any of the D transition lines, any shift in the frequency of emission of the light from the diode 10 within the band width of the transition line will result in a corresponding change in intensity of the transmitted beam 32, and therefore a resultant change in the output current of the diode 34. Thus, a constant output current from the diode 34 indicates a stabilised frequency of light emitted from the laser diode 10. However, due to small scale temperature and supply current $I_0$ fluctuations the frequency of the light from the laser, and thus the output current of the diode 34 will vary, and this variation may be used to correct the supply current to the laser 10 in order to maintain the frequency at a stabilised value. In practice, it is desirable to maintain the frequency of the light from the laser 10 at a mid-point within the bandwidth of one of the D transitions. However, this creates a problem in that a variation in intensity of the transmitted beam 32 resulting from a shift in frequency of the light from the diode 10 will be substantially the same whether the frequency of the diode 10 has increased or decreased from its nominal reference value. It is therefore necessary to introduce an AC modulation into the system in order to provide information on the direction of frequency drift of the light from the laser 10.

To this end, a signal generator 36 supplies an AC current having a saw-tooth profile to a Zeeman coil 38. The signal generator 36 and Zeeman coil 38 generate an oscillating magnetic field which periodically splits each of the D lines in accordance with the direction of the individual electron spins; each of the lines corresponding to a given sense of circularly polarised light. Because of the polarisation of the light (due to the quarter wave plate 18), the beam from the laser 10 will only excite one of the pairs of Zeeman lines. Thus, for an incoming beam from laser 10 whose frequency lies precisely at the mid point of the bandwidth of one of the D transition lines, the intensity of the transmitted beam 32 will vary substantially sinusoidally as the frequency of the single Zeeman line which is excitable by the incoming photons from the laser 10 oscillates to an equal extent either side of the frequency of the input laser beam.

This is shown in FIGS. 2A–2F illustrates the signal through the Zeeman coil 38, resulting in a cyclical Zeeman-splitting of the D transition line 40 illustrated in FIG. 2B. As mentioned above, because the incoming light from the laser beam 10 has been polarised only the transitions corresponding to one of the electron spins will be made manifest in the Zeeman-splitting and this transition is illustrated by the peak 40A in each of the wave forms in FIG. 2B. The other Zeeman-split transition does not absorb the incoming laser light (due to its polarisation), but is illustrated by the peak 40B for the purpose of completeness and clarity. FIG. 2B also shows a peak 42, which is the frequency of the laser light 10 used to excite the transitions, and it can be seen from the relationship between the peak 42 and the transition peaks 40A,B that the frequency of the light from the laser 10 is at the mid range of the frequency bandwidth of the D transition, and therefore lies in the middle of the two Zeeman lines. The resultant intensity of the transmitted beam 32 at the photodetector 34 will thus correspond to the signal wave form shown in FIG. 2C, which is substantially sinusoidal, and in any event, a regular wave form over the time period of a single cycle of the modulating current from the generator 36. If however, as illustrated in FIG. 2D, the frequency of the laser light drifts to one side of the mid point of the bandwidth of a transition line, then the intensity of the transmitted beam 32 will cause an output signal from the photodiode 34 as illustrated in FIG. 2E.

It is therefore possible to maintain a constant frequency of emission from the laser 10 by generating from the modulating signal produced by the signal generator 36, a square wave 50, shown in FIG. 2F, of adjustable phase, and dividing the output current from the photodiode 34 into two time periods each corresponding to half cycles of the square wave. These are then integrated. If the integration value of these two periods is not equal then the frequency of emission from the laser 10 does not lie at the centre of a D transition. Moreover, it is possible to determine which direction the frequency has drifted depending on whether the first integration value exceeds the second integration value, or vice versa. One way of achieving this is by a technique known as lock-in detection. An example of the circuitry required for this technique will now be described below.

Referring now again to FIG. 1, the output values from reference photodiode 14 and photodiode 34 are combined at a normalising circuit 50 which generates a signal whose value corresponds to the ratio of the DC levels of the two signals. This effectively calibrates out any alteration in the current which may occur at the photodiode 34 as a result of a shift in intensity of the beam from the laser 10. The normalised output of circuit 50 is then sent to a switching circuit 52. The switching circuit 52 also receives a square wave input generated by a digital dividing circuit 54: the dividing circuit 54 generates the square wave from the signal used to drive the Zeeman coils 38, provided by the signal generator 36. The phase of the square wave is variable relative to the input signal from signal generator 36 (to enable optimum set up). The input square wave at circuit 52 is used to divide the output signal from the normalising circuit 50 into half cycles. These are sent to an integrating circuit 58 which effectively integrates each half cycle and generates an error value $I_e$ dependent upon the difference between the values of the two half cycles. This error signal is then combined with the supply current $I_0$ to cause the output frequency of the laser 10 to return to its pre-ordained reference value.

I claim:

1. A method of obtaining a constant absolute frequency of emitted laser light from a laser diode upon switch-on of the laser diode by the passing of a drive current therethrough, the method comprising the steps of sequentially:

adjusting a temperature of the laser diode to a level which ensures that the frequency of emitted laser light will be either above or below a frequency of a predetermined group of transition lines of a predesignated substance;

adjusting the temperature of the laser diode until the frequency of emitted laser light lies within a bandwidth of a first predetermined transition line of said predetermined group;

maintaining the temperature of the laser diode at a constant level; and adjusting the drive current of the laser diode based on a response of the predesignated substance to the emitted laser light until the frequency of emitted laser light from the laser diode is maintained at a constant frequency relative to a bandwidth of a second predetermined transition line of the predetermined group of transition lines of the predesignated substance.

2. A method according to claim 1, further comprising the step of monitoring a change in the drive current of the laser diode occurring when the frequency of the emitted laser light is altered from within the bandwidth of said first predetermined transition line, to within the bandwidth of the second predetermined transition line of the predetermined group of transition lines of the predesignated substance, and comparing said change in the drive current with a predetermined value.

3. A method according to claim 2, wherein the first and second predetermined transition lines lie adjacent to each other.

* * * * *